United States Patent [19]

Bhat

[11] Patent Number: 5,773,088
[45] Date of Patent: Jun. 30, 1998

[54] TREATMENT SYSTEM INCLUDING VACUUM ISOLATED SOURCES AND METHOD

[75] Inventor: Pawan K. Bhat, Littleton, Colo.

[73] Assignee: Materials Research Group, Inc., Wheatridge, Colo.

[21] Appl. No.: 567,494

[22] Filed: Dec. 5, 1995

[51] Int. Cl.$^6$ .............................. H05H 1/24; C23C 16/00; C23C 14/00; B05C 13/00
[52] U.S. Cl. ....................... 427/294; 427/251; 427/569; 427/562; 427/576; 427/248.1; 427/255.5; 118/718; 118/719; 118/723 VE; 118/723 ME; 118/729; 118/733; 118/500; 204/192.1; 204/298.24; 204/298.25; 204/298.26
[58] Field of Search ................................. 427/446, 487, 427/561, 562, 566, 567, 569, 255.2, 294, 251, 248.1; 118/718, 719, 720, 723, 723 VE, 723 EB, 723 ME, 723 ER, 723 IR, 729, 730, 733, 500; 204/192.1, 298.23, 298.24, 298.25, 298.26; 134/61, 64 R, 67, 69, 82, 85; 425/576, 255.5

[56] References Cited

U.S. PATENT DOCUMENTS

| | | | |
|---|---|---|---|
| 3,114,652 | 12/1963 | Schetky | 118/718 |
| 3,572,286 | 3/1971 | Forney | 118/718 |
| 3,915,117 | 10/1975 | Schertler | 118/733 |
| 4,301,765 | 11/1981 | Behn et al. | 118/719 |
| 4,508,049 | 4/1985 | Behn et al. | 118/719 |
| 4,582,720 | 4/1986 | Yamazaki | 118/729 |
| 4,592,306 | 6/1986 | Gallego | 118/500 |
| 4,593,644 | 6/1986 | Hanak | 118/719 |
| 4,664,062 | 5/1987 | Kamohara et al. | 118/719 |
| 4,666,734 | 5/1987 | Kamiya et al. | 118/719 |
| 4,692,233 | 9/1987 | Casey | 118/719 |
| 4,763,601 | 8/1988 | Saida et al. | 118/719 |
| 4,946,576 | 8/1990 | Dietrich et al. | 8/90 |
| 5,076,205 | 12/1991 | Vowles et al. | 118/719 |
| 5,310,410 | 5/1994 | Begin et al. | 118/729 |
| 5,472,506 | 12/1995 | Tohma et al. | 118/719 |
| 5,512,320 | 4/1996 | Turner et al. | 118/729 |

OTHER PUBLICATIONS

*Websters 9th New Collegiate Dictionary*, Merriam–Webster, Inc., 1990 (No Month), Excerpts p. 212.

*Primary Examiner*—Marianne Padgett
*Attorney, Agent, or Firm*—Stephen C. Shear; Mike Pritzkau

[57] ABSTRACT

Treatment systems and associated methods for exposing one or more articles to at least one treatment source are disclosed herein. In one embodiment the system includes a single treatment source. The treatment source and the article or articles being treated are positioned in separately evacuable chambers. In a method of using the first embodiment, the article or articles can be removed from a handling chamber while the treatment source remains in an evacuated environment within a source chamber. Multi-source treatment systems and associated methods are also disclosed herein. Each treatment source in the multi-source systems is positioned in a respective evacuable chamber completely isolated from the other sources which make up the overall system. An evacuable multi-source handling chamber is arranged for selective movement between the source chambers. The multi-source handling chamber is moved from source to source to accomplish exposure of one or more articles to each source while both the article and the sources remain in an evacuated environment.

8 Claims, 10 Drawing Sheets

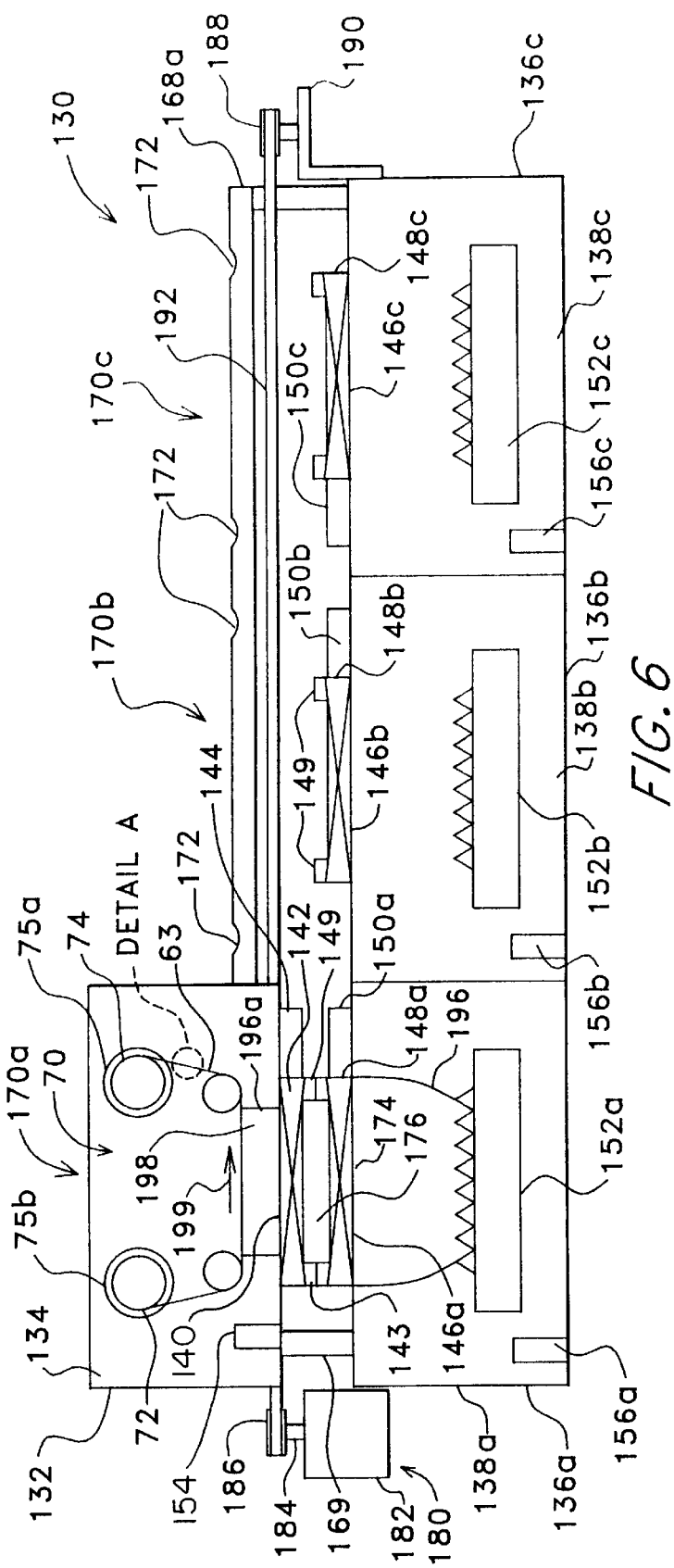

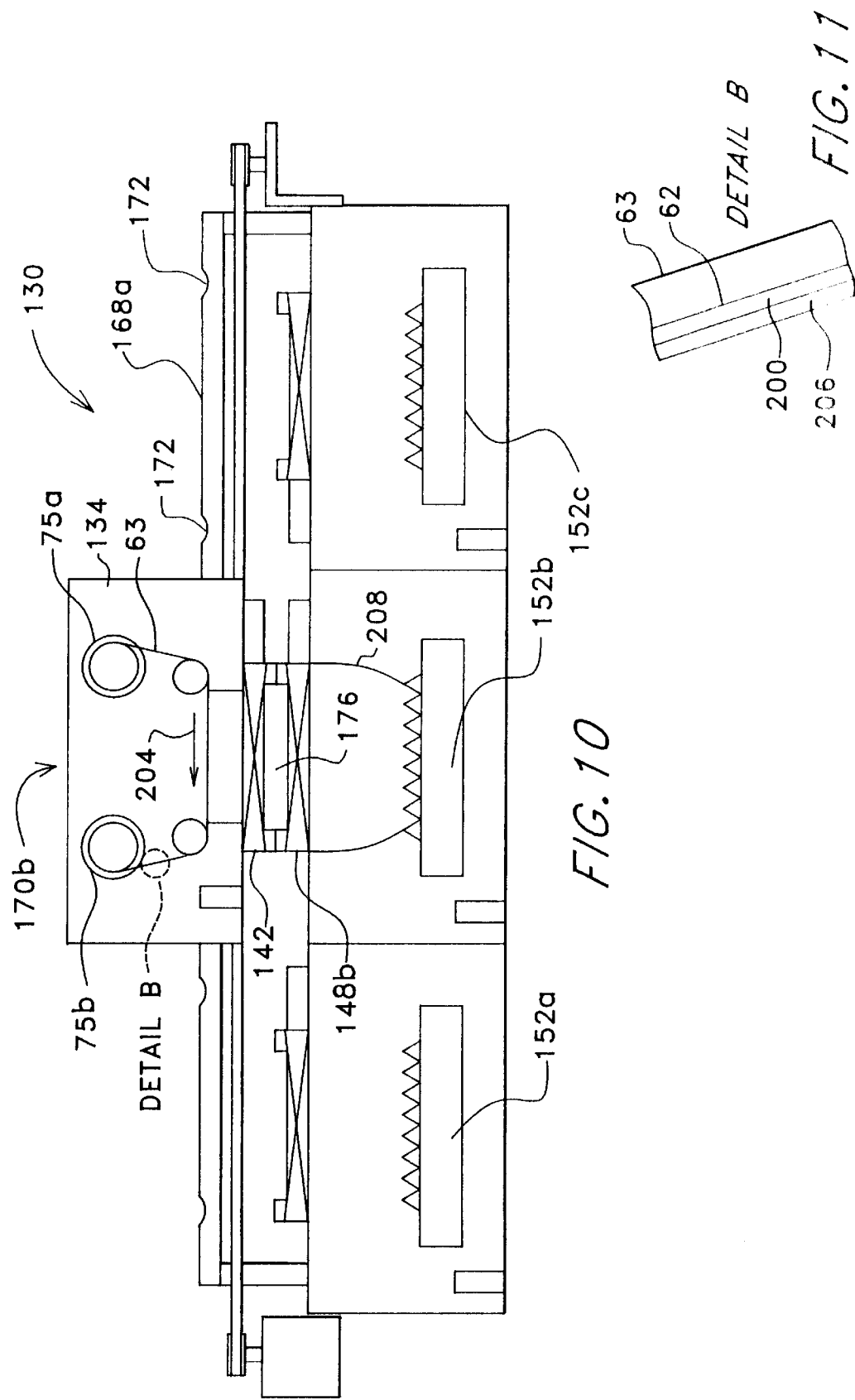

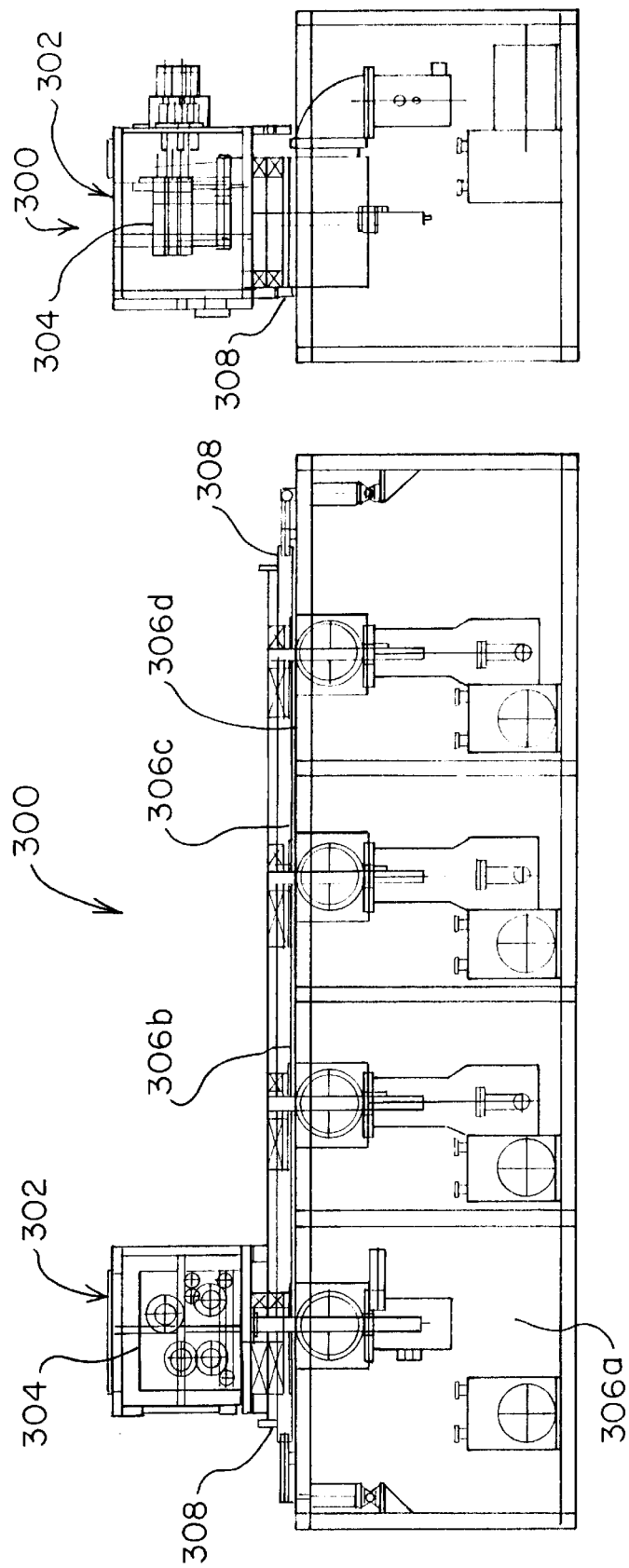

5,773,088

TREATMENT SYSTEM INCLUDING VACUUM ISOLATED SOURCES AND METHOD

BACKGROUND OF THE INVENTION

The present invention relates generally to a system for applying one or more treatments, for example coatings or thin films, to one or more articles, for example flexible underlying webs or substrates, in accordance with a treatment process which requires an evacuated environment and more particularly to a treatment system and associated methods which can maintain one or more treatment sources in evacuated isolation from an article to be treated or one which has already been treated and from one another in the case of multiple sources prior to, throughout and at the end of a particular treatment process.

The application of thin films in an evacuated environment is important in the production of a multitude of items including, for example, certain types of flexible or rigid photovoltaic cells, metallic coated plastic polymer sheet material serving as air seal packages for food products such as potato chips. The standard apparatus for use in treating articles in preparation for and in the application of the various vacuum applied thin films required by these items has typically placed the article or articles being treated into a common evacuable chamber with one or more treatment sources. FIG. 1 is a diagrammatic illustration of one such treatment apparatus, generally illustrated by the reference numeral 10. Treatment apparatus 10 includes an evacuable chamber 12 housing a treatment source 14 and an article such as, for example, an elongated flexible web 16 undergoing treatment. Treatment source 14 is representative of any number of sources which require an evacuated environment including, but not limited to conventional sources such as, plasma enhanced chemical vapor deposition (PECVD), sputtering cathodes and other evaporation sources. Flexible web 16 is supported by a conventional or readily providable transport mechanism 18 comprised of a supply reel 20, a take-up reel 22 and a pair of guide rollers 24. The web is initially installed on supply reel 20 and threaded through transport mechanism 18, as shown, to take-up reel 22.

In operation, flexible web 16 is progressively moved from supply reel 20 to take-up reel 22 through a treatment zone 26 in which a portion 28 of a particular surface of the web is exposed to and treated by source 14 until such time as substantially the entire web is received by take-up reel 22. Following treatment, web 16 must eventually be removed from chamber 12 which requires breaking the vacuum in chamber 12 with the ambient air pressure. Therefore, since web 16 and source 14 are both subjected to ambient pressure, the risk of possible contamination to the source is increased. Moreover, each time a new web is treated or the treated web requires further treatment from another source, chamber 12 must be re-evacuated again subjecting the source to additional contamination.

A second prior art apparatus including multiple sources is generally illustrated in FIG. 2 by reference numeral 30. Multi-source apparatus 30 represents a significant improvement over the apparatus of FIG. 1 in treatment procedures that require exposure of an article to multiple treatment sources. Apparatus 30 includes a housing 31 defining an overall common evacuable chamber 32 that is divided into a plurality of sub-chambers 32a-e by partitions 34a-d. Web 16 is once again illustrated undergoing the treatment procedure. A supply reel 36 is provided in sub-chamber 32a for initial installation of web 16 in roll form. Web 16 is threaded through a series of inter-chamber openings 38a-d to be received by a take-up reel 40 that is housed in chamber 32e. Sub-chambers 32b-d each house one of a plurality of treatment sources 42a-c that are selected in accordance with a specific multi-source treatment procedure.

Following evacuation of chamber 32 during the treatment procedure, web 16 is progressively advanced by take-up reel 40 in combination with supply reel 36 such that the web passes through a plurality of treatment zones 44a-c, one of which is associated with each respective treatment source. A particular combination of sources 42 can, for example, etch the substrate and/or apply successive thin film layers thereto without the need to expose either the sources or the substrate to ambient air pressure at intermediate points during the treatment process. However, multi-source apparatus 30 does possess disadvantages one of which obviously is that overall chamber 32 must be de-evacuated to replace the web, as in the case of apparatus 10.

Another disadvantage resides in cross-contamination between sources 42. This contamination results since the isolation of the sources in the sub-chambers is compromised by inter-chamber openings 38. For example, if source 42b is a sputtering source which emits copper 46 forming a thin film copper layer 48 on web 16 and if source 42c is a sputtering source which emits indium 50 forming a thin film indium layer 52 on copper layer 48, a portion 46a of copper 46 emitted by source 42b can contaminate indium source 42c with copper by passing through inter-chamber opening 38c in the direction indicated by arrow 53 thereby contaminating indium layer 52 with copper. Conversely, a portion 50a of indium 50 can pass through inter-chamber opening 38c in the opposing direction indicated by arrow 54 to contaminate the copper source thereby resulting in indium being present in the underlying copper layer 48. Depending upon the intended application, even very small amounts of cross-contamination can deleteriously affect the performance of an ultimately treated web 16. For example, contamination as low as 0.1 parts per million in a bi-layer of a thin film flexible photovoltaic cell or a thin film transistor produces significant performance degradation.

Continuing to refer to FIG. 2, system 30 includes still another disadvantage in that web 16 is moved at a constant speed relative to each of sources 42. This constant movement rate must be considered relative to each source in view of desired process results. In other words, the advancement rate must be compatible with each and every source of the multi-source apparatus. Therefore, process conditions are partially controlled by the advancement speed of the web.

As will be seen hereinafter, the present invention introduces highly advantageous systems and associated methods for producing single or multi-source thin film layers while reducing or altogether eliminating the need to break the vacuum in the respective chambers, alleviating cross-contamination between sources and providing for a broader range of process conditions.

SUMMARY OF THE INVENTION

As will be described in more detail hereinafter, there are disclosed herein systems and associated methods for exposing one or more articles to at least one treatment source in accordance with specific treatment processes. Each system, like the apparatus of FIGS. 1 and 2, exposes the article to the treatment source in an evacuated environment. However, in accordance with a first, single source embodiment of the present invention, the system includes a first evacuable article chamber for receiving at least a first one of the articles, and a second evacuable source chamber containing a treatment source therein and a passage between the two chambers. Passage operating means forming part of this system selectively opens and closes the passage in a vacuum sealed manner by moving between a first, open position such that the chambers are in communication with one another through the passage and a second, closed position such that the chambers are vacuum sealed from one another. The system includes means for evacuating the two chambers after which an article within the article chamber can be treated by the treatment source within the source chamber through the passage therebetween when the latter is open.

In a method of using the first embodiment, a first one of the articles is positioned in the first chamber. The treatment source is positioned in the second chamber. The first and second chambers are evacuated. Then, the first article is exposed to the treatment source through the passage which is maintained in its opened position. Thereafter, the passage is closed so that the second chamber can remain evacuated while the first chamber is opened to the ambient surroundings to permit replacement of the first article with a second article and subsequent re-evacuation of the first chamber, all while the treatment source remains in an evacuated environment in the second chamber.

In accordance with a second embodiment of the present invention, the system treats at least one surface of at least one article in accordance with a treatment process that requires the exposure of the one surface of the article to a plurality of treatment sources in an evacuated environment. The system includes means defining an evacuable handling or article chamber designed to receive the article, and a handling chamber opening. The system also includes means defining a plurality of treatment source chambers, one for each of the treatment sources, and corresponding source chamber openings. Opening control means also forming part of the system selectively opens and closes each of the chamber openings. The handling chamber defining means is selectively movable by moving means in cooperation with the source chambers such that each source chamber opening can be temporarily aligned with the handling chamber opening so as to expose successively the one article surface to each of the sources through the temporarily aligned openings. Evacuation means cooperates with the opening control means and the moving means for maintaining the source chambers and the handling chamber in an evacuated state during exposure of the article and movement of the handling chamber so that the treatment sources and the article can be maintained under vacuum throughout the ultimate exposure of the article surface to all of the treatment sources. As in the single source embodiment, in this multi-source embodiment, the source chambers can be maintained in their evacuated states while the treated article is replaced with a new one.

In a method of using the second embodiment, a surface of the article is exposed to a plurality of treatment sources in an evacuated environment. The article is positioned in the handling chamber which is evacuated, as are the source chambers. The handling chamber is selectively moved so as to temporarily align each of the source chamber openings with the handling chamber opening. The first article surface is exposed to the sources by selectively opening and closing the chamber openings in a way which sequentially exposes the article surface to each of the sources through the temporarily aligned openings. During the exposure and movement each of the treatment sources and the article are continuously maintained under vacuum. Thereafter, the treated article can be replaced with a new article while maintaining the source chambers under vacuum.

BRIEF DESCRIPTION OF THE DRAWINGS

The present invention may be understood by reference to the following detailed description taken in conjunction with the drawings, in which:

FIG. 6 is a diagrammatic elevational cross-sectional view, taken generally along line 6—6 of FIG. 5, which is shown here to further illustrate details of the arrangement of the multi-source system for treating an elongated flexible web in accordance with a particular treatment process.

FIG. 7 is an enlarged diagrammatic elevational cross-sectional view, taken generally along line 7—7 of FIG. 5, which is shown here to further illustrate details of a handling chamber transport mechanism.

FIG. 8 is an enlarged elevational side view illustrating Detail A, taken from FIG. 6, shown here to illustrate the appearance of the flexible web following its exposure to a first treatment source.

FIG. 10 is a diagrammatic elevational cross-sectional view, similar to the view presented in FIG. 6, except that the handling chamber is shown in position at the second treatment station.

FIG. 11 is an enlarged diagrammatic elevational side view illustrating Detail B, taken from FIG. 10, shown here to illustrate the appearance of the flexible web following its exposure to a second treatment source.

FIG. 16 is a cross-sectional elevational side view of an actual working embodiment of a multi-source web treatment system manufactured in accordance with the present invention.

FIG. 17 is a cross-sectional elevational end view of the multi-source web treatment system of FIG. 16.

DETAILED DESCRIPTION OF THE INVENTION

Figure 1:
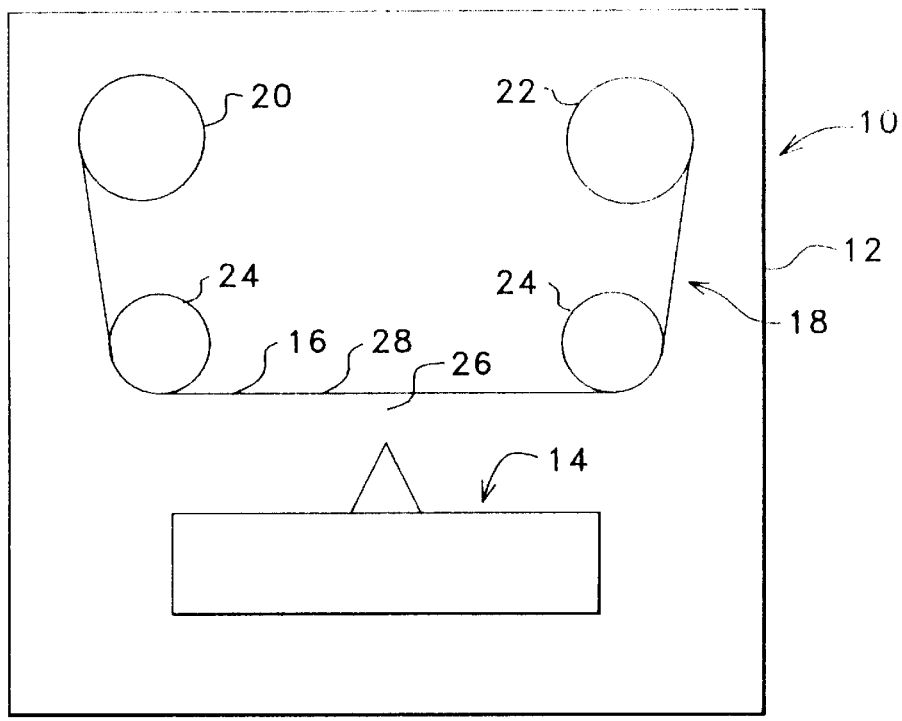
FIG. 1 is a diagrammatic cross-sectional elevational view of a prior art apparatus for use in exposing a web surface to a treatment source.

Systems for use in treating articles in accordance with a particular treatment process in an evacuated environment are disclosed herein. Articles treatable by the systems may include, but are not limited to, for example, flexible webs or individual substrates which can be rigid or semi-rigid. Having described FIGS. 1 and 2 previously, attention is immediately directed to FIG. 3 which illustrates a first embodiment of a treatment system, generally indicated by reference numeral 60, at an intermediate step in a method of treating a web surface 62 of an elongated flexible web 63, in accordance with the present invention. Web 63 may be formed from polymeric materials, metallic foils or ceramic materials. The latter may be electrically conductive or non-conductive and can be coated with metal and/or plastic materials prior to treatment by the system of the present invention. The thickness of web 63 may vary over a broad range and is primarily dependent upon its intended end use. Web 63 may ultimately be used in a broad array of end applications such as, for instance, a flexible photovoltaic panel, packaging for food products or as garment fabric. System 60 includes a housing 64 defining a first evacuable chamber 66 and an additional second evacuable chamber 68. First evacuable chamber 66 receives and supports by suitable means (not shown) a web transport mechanism 70 comprised of a supply reel 72, a take-up reel 74, take-up and supply reel motors 75a and 75b, respectively, and a pair of guide rollers 76. Take-up reel motor 75a and supply reel motor 75b are each operable at various speeds so as to selectively vary the movement rate of web 63. The web may be advanced in either direction at predetermined rates by the motors. Flexible web 63 is initially installed on supply reel 20 and threaded through web transport mechanism 70 to take-up reel 74, as shown. Mechanism 70 is initially positioned within chamber 66 through a cooperating door (not shown) leading into the chamber.

Figure 3:
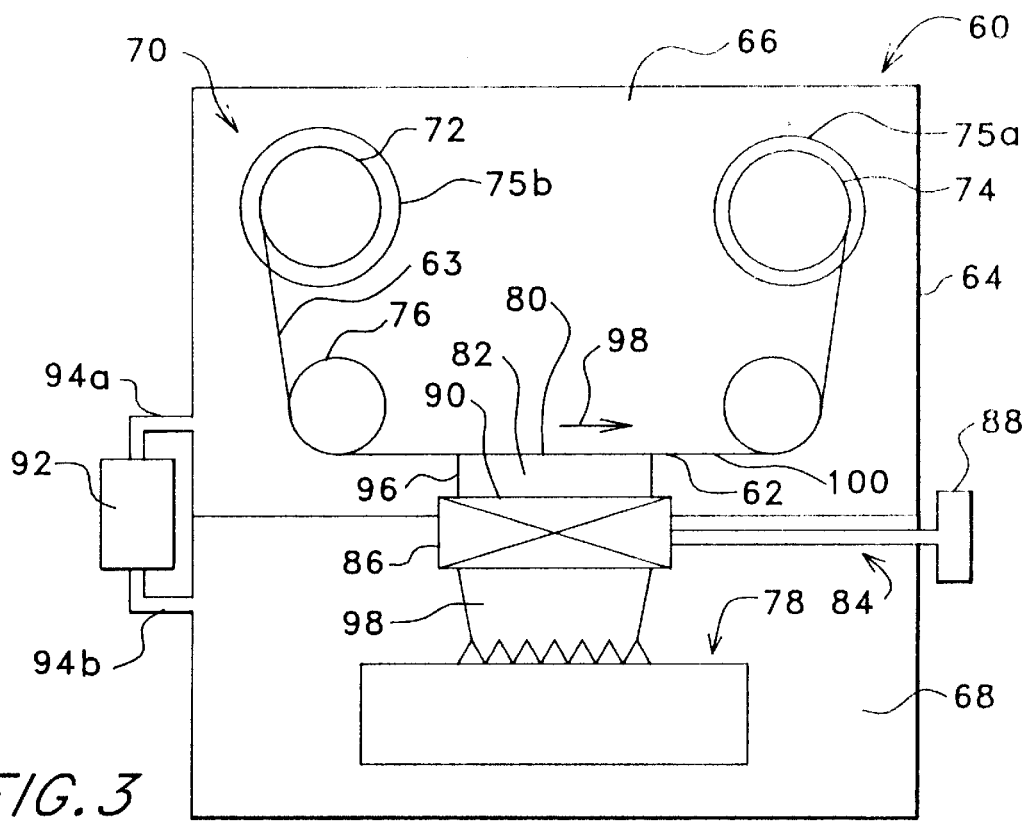
FIG. 3 is a diagrammatic cross-sectional elevational view of a first embodiment of a treatment system designed in accordance with the present invention for use in exposing a continuous web in an evacuated environment to a treatment source.

Continuing to refer to FIG. 3, a treatment source assembly 78 is positioned in second chamber 68 such that its emissions or emitted materials are directed upwardly to avoid problems induced by particulate material falling onto web 63. Treatment source assembly 78 is representative of any number of sources which require an evacuated environment including, but not limited to, conventional sources such as, plasma enhanced chemical vapor deposition (PECVD), sputtering cathodes and other evaporation sources.

The overall system includes a gate valve assembly 84 which, in turn, includes a gate valve 86 and a control mechanism 88 positioned outside the chambers. Gate valve 86 forms a passage 90 between first chamber 66 and second chamber 68 that can be selectively opened or closed by control mechanism 88. When gate valve 86 is set in the open position by control mechanism 88, first chamber 66 and second chamber 68 are in communication with one another through passage 90 such that confronting portion 80 of web surface 62 can be exposed to source 78 through the passage. Conversely, when gate valve 86 is set to the closed position by control mechanism 88, it forms a vacuum seal between the two chambers such that the chambers are isolated from one another and each chamber is capable of maintaining a vacuum regardless of the state of the other chamber.

Because of the configuration of system 60, first and second chambers 66 and 68 can be individually evacuated by a vacuum source 92 via evacuation lines 94a and 94b. It should be noted that many modifications can be made to the illustrative evacuation arrangement depicted, within the scope of the present invention. For example, evacuation line 94b can be eliminated in which case chamber 68 is evacuated through chamber 66 using only evacuation line 94a. Alternatively, each chamber can be evacuated by, for example, diffusion pumps (not shown) positioned within each of the respective vacuum chambers in vacuum communication with one or more vane pumps (not shown) that are positioned external to chambers 66 and 68.

In accordance with one method of using the system of FIG. 3, web 63 is positioned in web transport mechanism 70 prior to evacuation of the chambers. Chambers 66 and 68 are then evacuated by vacuum source 92. Following evacuation, transport mechanism 70 is activated whereby to advance web 63 at a particular generally constant rate of speed in the direction of arrow 96, as determined by the speed of motor 75. During advancement of the web, treatment source 78 is actuated so as to, for example, emit a depositable material 98 to form a thin film layer 100 on web surface 62. Material 98 passes through passage 90 with gate valve 86 in its open position and is deposited on portion 80 of the web in treatment zone 82, shown in FIG. 3.

After substantially the entire web surface has been exposed to source 78, gate valve 86 is closed to preserve the integrity of the vacuum in second chamber 68. The vacuum in chamber 66 can then be broken and web 63 can be removed therefrom without breaking the vacuum in chamber 68. In accordance with the present invention, source 78 can remain in the evacuated environment of chamber 68 while web 63 is removed from chamber 66 for replacement with another web (not shown).

Figure 4:
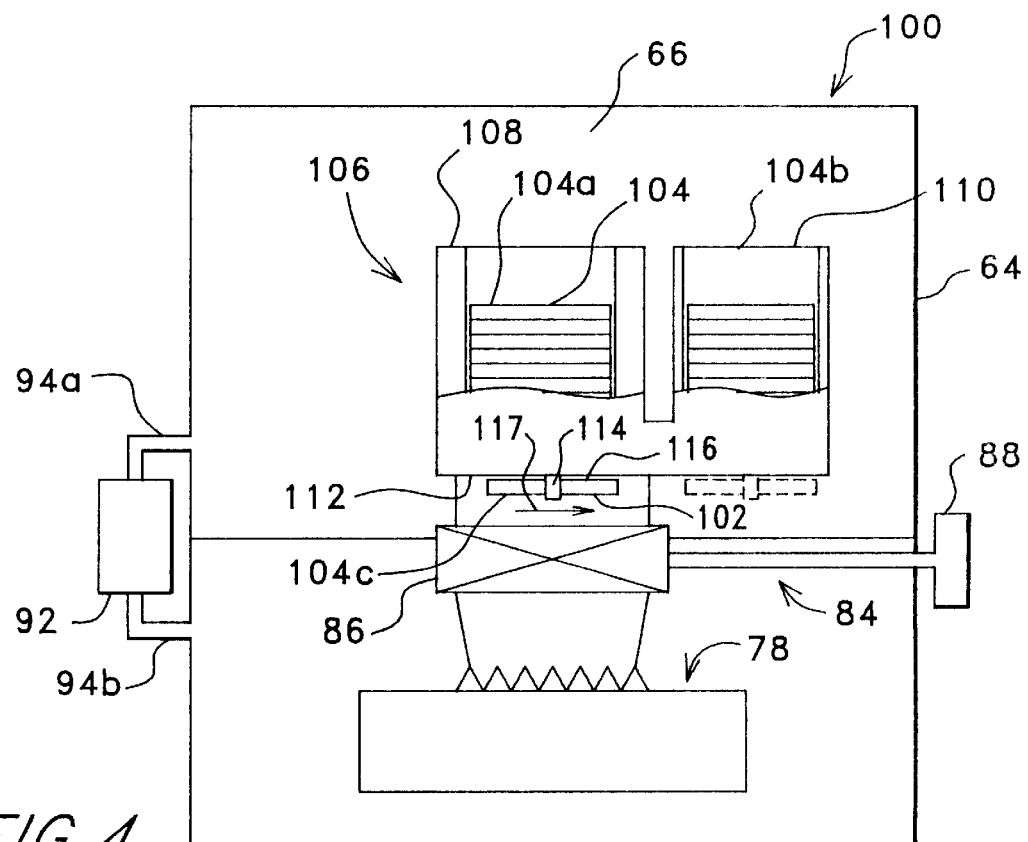
FIG. 4 is a partially cut-away diagrammatic cross-sectional elevational view of a second embodiment of a treatment system designed in accordance with the present invention for use in exposing a plurality of articles in the form of substrates in an evacuated environment to a treatment source.

Attention is now directed to FIG. 4 which illustrates a second embodiment of a treatment system, generally indicated by reference numeral 100, at an intermediate step in a method of treating respective surfaces 102 of a plurality of articles such as substrates 104. The latter can be rigid or semi-rigid and can be formed from various materials such as, for example, glass, ceramic or plastic of a suitable thickness, as determined primarily by the end application. System 100 is identical to system 60, shown in FIG. 3, with the exception that web transport mechanism 70 has been replaced with a cassette substrate handler 106 which is mounted within chamber 66 by suitable means (not shown). Substrate handler 106 includes a supply side mechanism 108 and a post-treatment mechanism 110. An unexposed stack 104a of substrates 104 is received by supply mechanism 108, while an exposed stack 104b of substrates is received by post-treatment mechanism 110. A transfer mechanism 112 including an opposing pair of substrate clamps 114 (only one of which is shown) are positioned at the lower end of handler 106. A substrate 104c from the stack of untreated substrates 104a is held by clamps 114 in a treatment zone 116 in which substrate 104c is exposed to source 78. Transfer mechanism 112 includes means (not shown) for moving the substrate clamps 114 to permit a transfer of the substrate in the direction indicated by arrow 117 from treatment zone 116 to post-treatment mechanism 110 as shown by dotted lines in FIG. 4.

With the exception of the way substrate handler 106 functions, the operation of system 100 is identical to system 60 of FIG. 3 with regard to the previously described procedures for the evacuation of chambers 66 and 68, the use of gate valve 86 and the operation of source 78. However, substrate handler 110 permits system 100 to expose surface 102 of each substrate 104 to source 78. During operation, the stack of unexposed substrates 104a is sequentially lowered within supply mechanism 108 until each substrate is, in its turn, received by clamps 114 in treatment zone 116 for exposure to the source for a predetermined period of time. The substrate is then placed at the bottom the stack of exposed substrates from treatment zone 116 and clamps 114 are then returned to the treatment zone preparatory to receiving another unexposed substrate. This process continues until such time that the entire stack of unexposed substrates 104a has been exposed and transferred. In accordance with the present invention, treated or exposed substrates can then be removed from the system and unexposed substrate stack 104a can be replenished without breaking the vacuum in chamber 68 such that source 78 remains in an evacuated environment.

While the treatment of articles such as the foregoing flexible webs and substrates, as illustrated by mechanisms 70 and 106, respectively, are significant applications of the present invention, it should be mentioned that any number of different article handling mechanisms are adaptable for use in the handling chamber of the single and multi-source systems of the present invention. Consequently, the usefulness of the present invention is not limited to the treatment of flexible webs and substrates, but also extends to the application of thin film coatings or treatments to a virtually unlimited variety of other types of articles.

Figure 5:
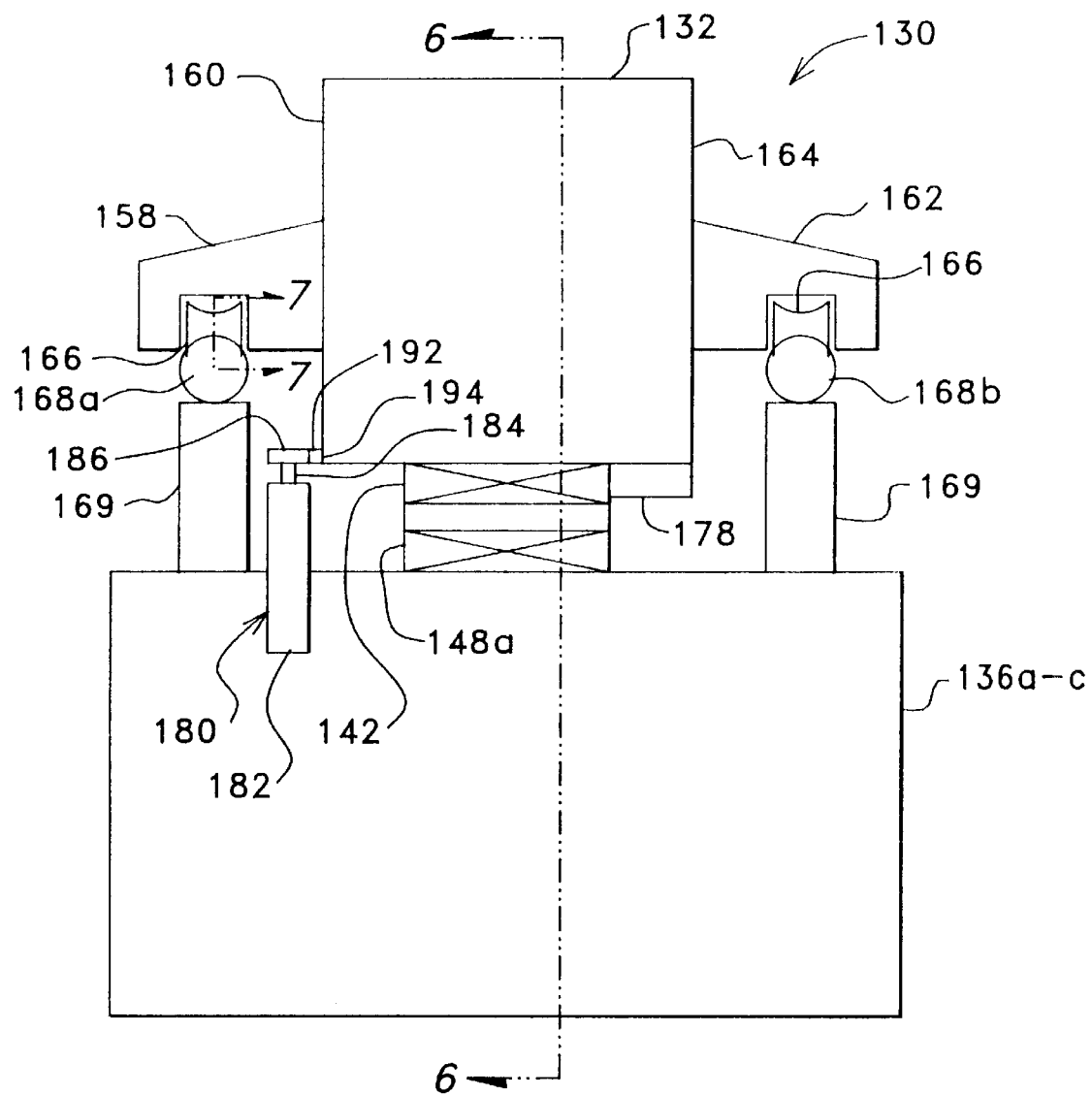
FIG. 5 is a diagrammatic elevational end view of a multi-source treatment system including a selectively movable handling chamber in accordance with the present invention.

Attention is now directed to FIGS. 5 and 6 which illustrate a multi-source embodiment of a treatment system generally indicated by reference numeral 130, at an intermediate step in a method of treating web surface 62 of elongated flexible web 63, in accordance with the present invention. Multi-source treatment system 130 includes a handling chamber housing 132 defining an evacuable handling chamber 134 and a plurality of treatment source chamber housings 136a-c each of which defines a respective evacuable treatment chamber 138a-c. In the present example and for purposes of simplicity, the system is shown and described as including three treatment chambers, although any number of source chambers may be utilized, as will be seen hereinafter.

Handling chamber housing 132 defines a handling chamber opening 140 at the bottom of handling chamber 134 in which a handling chamber gate valve 142 is mounted in a vacuum sealed manner. Handling chamber gate valve 142 includes a peripheral sealing lip 143 and is movable between an open position and a closed position by a handling chamber gate valve control mechanism 144. With gate valve 142 in its closed position, as determined by control mechanism 144, the handling chamber is vacuum sealed from the exterior environment. Handling chamber 132 receives previously described web transport mechanism 70 through an opening or conventional vacuum sealable door (not shown) in the same manner as chamber 66. Flexible web 63 is initially installed on supply reel 72 and threaded through web transport mechanism 70 to take-up reel 74, as shown.

Each treatment source chamber housing 136 defines a respective treatment source chamber opening 146a-c in the top of the housing in which a respective source chamber gate valve 148a-c is mounted in a vacuum sealed manner. Each source gate valve 148 includes a respective peripheral sealing lip 149a-c and a respective source gate valve operating mechanism 150a-c such that the source gate valves are selectively movable between an open position and a closed position by source operating mechanisms 150a-c. With gate valves 148 in their closed positions, as determined by operating mechanisms 150, the source chambers are vacuum sealed from the exterior environment. Each respective treatment chamber also includes one of three treatment sources 152a-c positioned therein. Treatment sources 152 are selected in accordance with an overall treatment plan that is, of course, dependent upon the intended final use of web 63 or any other such article being treated. Any number of different types of sources including, but not limited to, conventional sources of the types previously described may be positioned in the treatment chambers in view of a particular treatment process. Since the number of different processes for treating an article such as web 63 are unlimited, the number of possible permutations of treatment sources which may be used is also unlimited. It should be appreciated, therefore, that multisource system 130 may be modified to suit any of these processes.

Handling chamber 134 is evacuable by a handling chamber vacuum pumping arrangement 154 while source chambers 138a-c are each evacuable by individual source chamber vacuum pumping arrangements 156a-c, respectively. Any suitable pumping arrangement may be utilized in the application provided that sufficient vacuum is available for the treatment process at hand.

Referring now to FIG. 7 in conjunction with FIGS. 5 and 6, handling chamber 132 includes a first pair of brackets 158 (only one of which is shown) fixedly attached to a first side 160 of handling chamber 132 and a second pair of brackets 162 (only one of which is shown) fixedly attached to an opposing second side 164 of the handling chamber. Each bracket rotatably receives one of four rail wheels 166. An opposing pair of rails 168a and 168b are fixedly mounted to treatment chamber housing 136 (only rail 168a can be seen in FIG. 7). Rail wheels 166 are configured to roll on rails 168 such that handling chamber 132 is movable on the rails between on of three treatment stations 170a-c adjacent respective treatment chambers 138a-c. Each rail includes detents 172 arranged such that, when handling chamber 134 is adjacent a treatment station, such as station 170a, the rail wheels are received in a detent 172, as illustrated in FIG. 8. In this position, handling chamber gate valve 142 is brought into alignment with source gate valve 148a. The peripheral sealing lips 143 and 149a of gate valves 142 and 148a, respectively, are positively engaged and cooperate to form a vacuum seal therebetween such that a vacuum sealed passage 174 is defined between source chamber 138a and handling chamber 134. It should be appreciated that passage 174 can be opened or closed at will in a variety of different ways by placing gate valves 142 and 148a in their respective open or closed positions. With both gate valves closed and vacuum sealed to one another, an evacuable intervalve chamber 176 is defined therebetween. Inter-valve chamber 176 is evacuable apart from the other vacuum chambers which make up the system by using an inter-valve chamber vacuum pumping arrangement 178 which is in vacuum communication with inter-valve chamber 176.

Referring again to FIGS. 5 and 6, handling chamber 132 can be selectively moved between treatment stations 170a-c by a transport mechanism 180. Transport mechanism 180 includes a motor 182 mounted on source chamber housing 136a. Motor 182 includes an output shaft 184 having a sprocket 186 mounted thereon. At the opposite end of the treatment system an idler sprocket 188 is rotatably received by a bracket 190 which is, in turn, mounted on source chamber housing 136c. A chain 192 is received by sprocket 186 and idler sprocket 188 for selective movement by motor 182. Chain 192 is attached to surface 160 of handling chamber housing 132 at least at one point 194. In this configuration, selective movement of chain 192 results in a corresponding movement of handling chamber 132 along rails 168a and 168b between treatment stations 170. Many modifications (not shown) may be made to the transport mechanism described above. For example in one alternative configuration, the detented rails and rollers are positioned beneath the handling chamber. In another alternative configuration, a motor including a sprocket received on its output shaft can be mounted directly on handling chamber housing 132. The sprocket can then engage a single chain extending along the length of the treatment system thereby moving the handling chamber. These modifications are all considered to be within the scope of the present invention. It is also to be understood that, while the illustrated embodiments transport the handling chamber, the present invention contemplates any relative movement between the handling chamber and source chambers provided only that the necessary alignment of these chambers is accomplished.

In accordance with one method of using multi-source treatment system 130, handling chamber 134 is evacuated by handling chamber pumping arrangement 154 and source chambers 138a-c are evacuated by source chamber pumping arrangements 156a-c with all of the gate valves in their closed positions. Handling chamber 134 is then positioned at treatment station 170a adjacent source chamber 138, as shown in FIG. 7. With rail wheels 166 received in the appropriate detents 172 on rails 168a and b, handling chamber gate valve 142 and source chamber gate valve 148a are engaged to form a vacuum seal therebetween. Prior to opening any gate valve, inter-valve chamber 176 is evacuated using inter-valve chamber pumping arrangement 178. Thereafter, gate valves 142 and 148a are opened such that passage 174 through intervalve chamber 176 is opened and source chamber 138a is in vacuum communication with handling chamber 132.

Turning now to FIG. 8 in conjunction with FIGS. 5 and 6, exposure of surface 62 of web 63 through passage 174 can then commence by activating source 152a so as to emit, for example, a first depositable material 196. Take-up motor 75a of web transport mechanism 70 is also activated to advance web 63 through a treatment zone 198 adjacent passage 174 at a predetermined rate in the direction of arrow 199. As the web is advanced, a portion 196a of depositable material 196 passes through passage 174 and is deposited on surface 62 of the web as a first layer 200, as illustrated in FIG. 8. This process continues until such time that substantially all of surface 62 has been exposed to source 152a and most of web 63 is received by take-up reel 74. Following exposure to source 152a, handling chamber gate valve 142 and first source chamber gate valve 148a are closed by their respective operating mechanisms so that source 152a and web 63 are in vacuum isolation. It is important to note that the thickness of layer 200 is determined by two factors. First, its thickness is directly dependent upon the rate at which material 196 is emitted from source 152a and, second, the thickness is also directly dependent upon the predetermined rate of advancement of the web by transport mechanism 70. It should be also be noted that the thickness of the deposited layers shown herein are exaggerated for illustrative purposes. As will be described hereinafter and in view of the foregoing discussion, system 130 of the present invention provides process flexibility with regard to the thickness of multiple layers, in a multi-source web handling system, which has not previously been seen.

Figure 9:
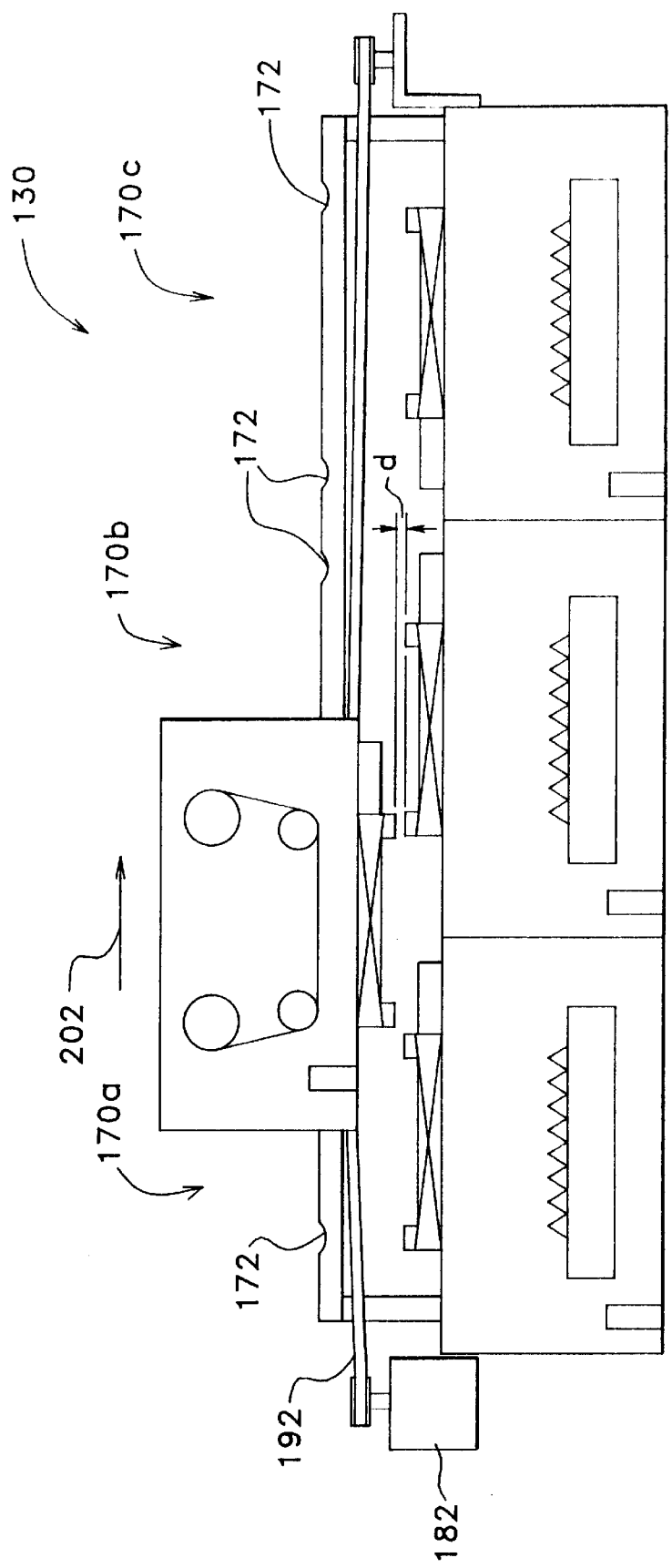
FIG. 9 is a diagrammatic elevational cross-sectional view, similar to the view presented in FIG. 6, shown here to illustrate the handling chamber at an intermediate point in being moved between first and second treatment stations.

Reference is now made to FIG. 9 wherein handling chamber 134 is shown at an intermediate point in being moved from treatment station 170a to treatment station 170b in the direction indicated by an arrow 202. Movement is accomplished by actuation of motor 182 thereby advancing chain 192 so as to cause the rail wheels to become unseated from detents 172 associated with treatment station 170a. As the rail wheels are unseated, the handling chamber is raised a distance d to separate aligned gate valves 144 and 148a. Chain 192 continues advancing to urge the handling chamber in the direction of treatment station 170b as the rail wheels roll along on rails 168. All gate valves remain closed during the movement such that web 63 and each of the treatment sources remain in an evacuated environment within their respective chambers.

FIGS. 10 and 11 illustrate the arrival of handling chamber 134 at treatment station 172b. The handling chamber is positively located in position as the rail wheels engage detents 172 on rails 168 associated with treatment station 170b. It should be mentioned that many arrangements other than the detented rail system illustrated herein may be provided for positively locating the handling chamber relative to the source chambers. For example, a separate lifting system may be provided which directly raises or lowers the handling chamber relative to the source chambers once the rail wheels engage the detents. These arrangements are based on factors such as the weight of the handling chamber, which can be significant. Once the handling chamber is in position, inter-valve chamber 176 is now defined between handling chamber gate valve 142 and treatment chamber valve 148b and the latter are vacuum sealed to one another. Following evacuation of inter-valve chamber 176, valves 142 and 148b can be opened to permit the exposure of surface 62 of web 63 to treatment source 152b in a manner similar to that described above with regard to source 152a. However, rather than first rewind web 63 onto supply reel 72, the web is simply advanced for exposure in the direction indicated by arrow 204 by supply motor 75b to deposit a second layer 206 of a material 208 that is emitted by source 152b onto previously deposited layer 200, as illustrated in FIG. 11. In this way, the throughput of the system is improved since rewinding of the web is avoided. The process of exposure and subsequent movement to a next treatment station continues in this manner until the web has been exposed to all of the sources.

Multi-source treatment system 130 provides the advantage associated with the previously described single source embodiments of the present invention in that the treatment sources can remain in an evacuated environment while the web or other such article being treated is replaced in the handling chamber following a treatment process. However, the multi-source systems disclosed herein also provide advantages over prior art multi-source systems such as the one shown in FIG. 2, as will be described immediately hereinafter.

In accordance with a first advantage, cross-contamination between sources as shown previously in FIG. 2 is eliminated, since the treatment sources are isolated from one another in their respective treatment chambers throughout a representative treatment process. In processes such as, for example, web coating to produce thin film photovoltaic panels, for example amorphous silicon thin film based materials, copper selenium or cadmium telluride, purity of the deposited materials is critical to the overall operation of the panel.

In accordance with a second advantage, the web or other such article being treated and the treatment sources can advantageously remain in evacuated environments throughout an overall treatment procedure even though the treatment chambers are isolated from one another. In this way, the possibility of introducing contaminants from the ambient environment is significantly reduced by avoiding the need to break the vacuum in any of the respective chambers throughout the treatment process.

Figure 2:
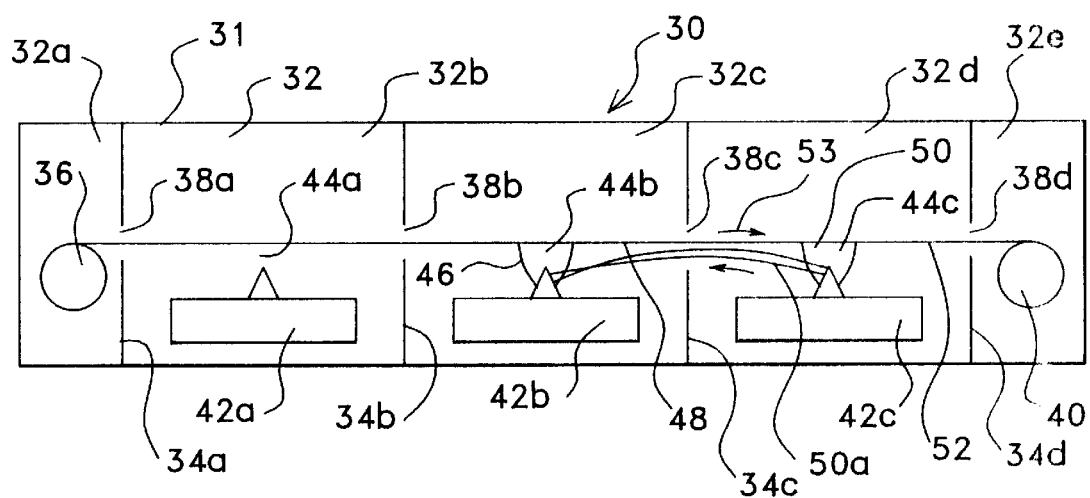
FIG. 2 is a diagrammatic cross-sectional elevational view of another prior art apparatus for use in exposing a web surface to a plurality of treatment sources.

In accordance with a third advantage, the range of possible process conditions is considerably broadened because the rate of web advancement can be independently varied from source to source so as to accommodate combinations of sources and deposited layer thicknesses which are not possible in the prior art multi-source system of FIG. 2.

Figure 12:
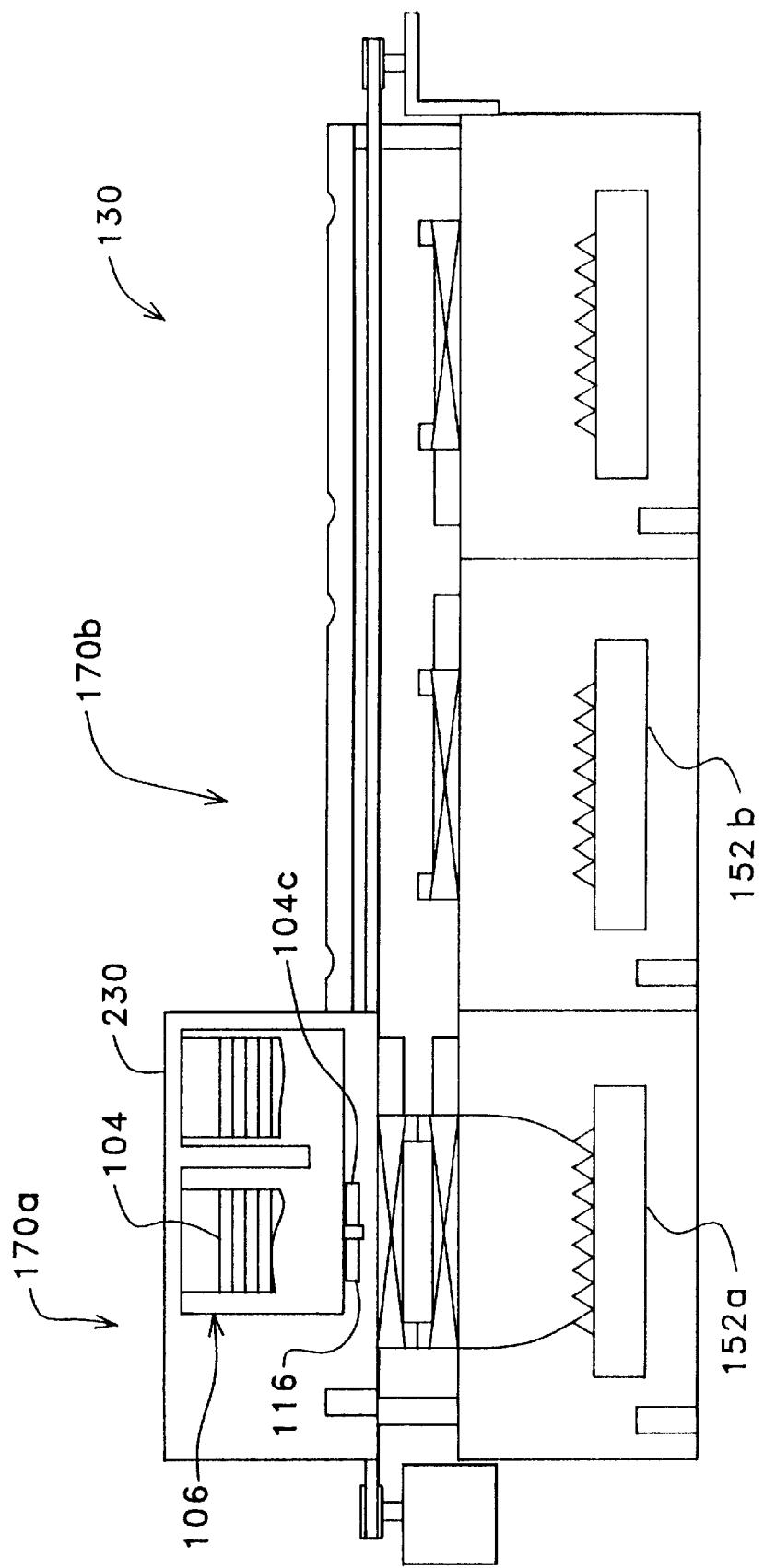
FIG. 12 is a diagrammatic elevational cross-sectional view of the multi-source system initially shown in FIG. 5 except that the handling chamber including the web transport mechanism has been replaced with another handling chamber that includes a cassette substrate handler for manipulating substrates, illustrating the modular nature of the multi-source system of the present invention.

In accordance with a fourth advantage, isolation of the various chambers facilitates maintenance and reduces downtime of the overall system. Furthermore, the system is inherently modular thus permitting ready substitution of either treatment sources or article handling chambers. For example, system 130 is once again repeated in FIG. 12, except that web handling chamber 134 has been replaced with a substrate handling chamber 230 that includes cassette substrate handler 106, which was previously shown and described with regard to FIG. 4. Cassette handler 106 is positioned at treatment station 170a for exposing each substrate 104 to source 152a.

Figure 13:
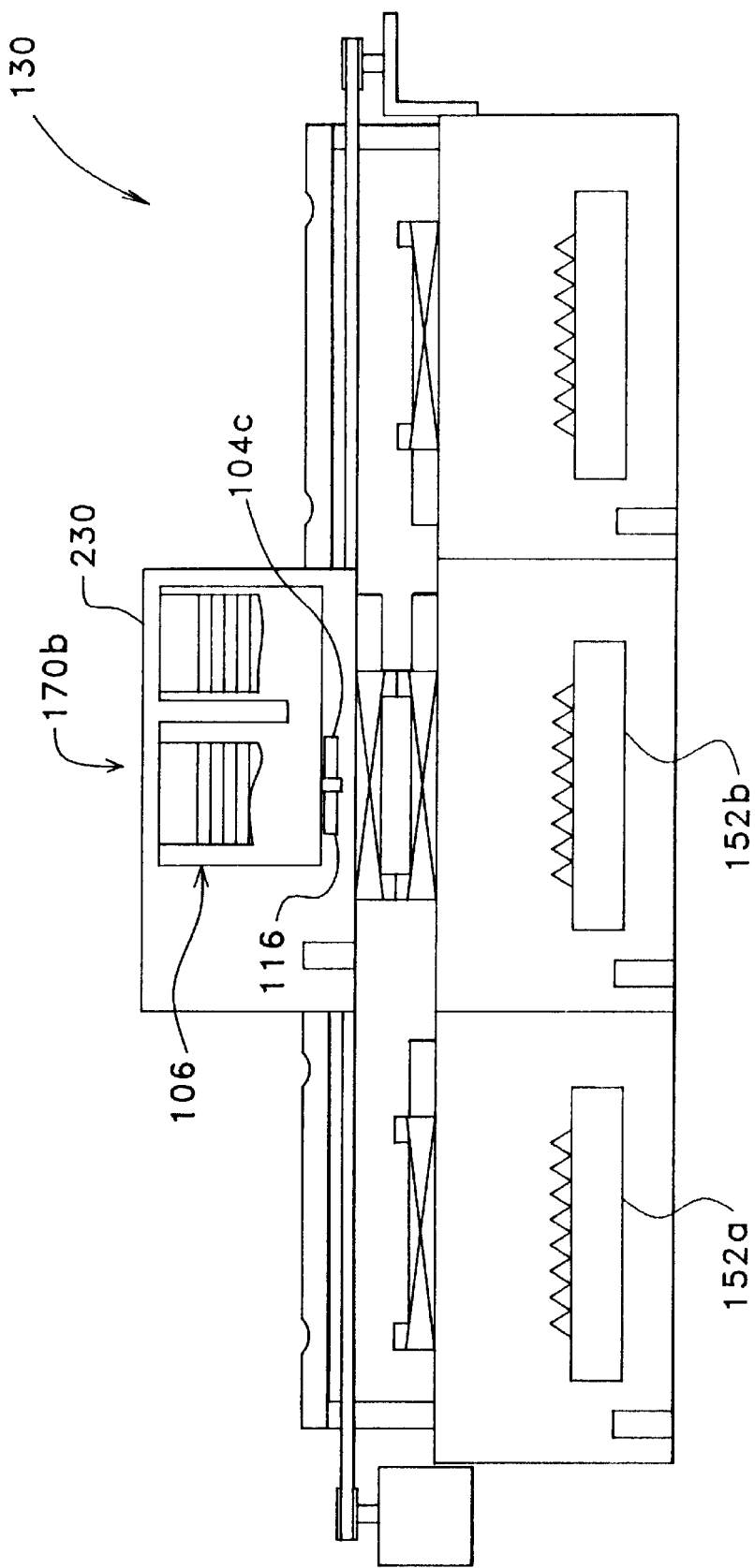
FIG. 13 illustrates the system of FIG. 12 with the replacement handling chamber and cassette substrate handler positioned at the second treatment station.

In FIG. 13, modular substrate handling chamber 230 has been moved to treatment station 170b for exposure of the substrates to source 152b. In the present example, it is worthy of mention that the substrates can be exposed to the sources in a number of different sequences. In one case, the substrates are all be exposed to an individual source such as 152a before moving cassette handler 106 to a successive treatment station. In another case, substrate 104c can remain at treatment position 116 for successive movement of the cassette handler to each treatment station whereby to expose substrate 104c to all of the treatment sources prior to exposing any of the other substrates. This latter described process can be useful in instances where the treatment process requires exposure of the substrates at relatively high temperatures, particularly where the substrates are sensitive to heat cycling. Since each substrate remains at the treatment position throughout its exposure, a heater (not shown) positioned in substrate handling chamber 230 can be used to provide a constant substrate temperature throughout the exposure of each individual substrate to alleviate the problems such as, for example, substrate cracking caused by heat cycling.

Figure 14:
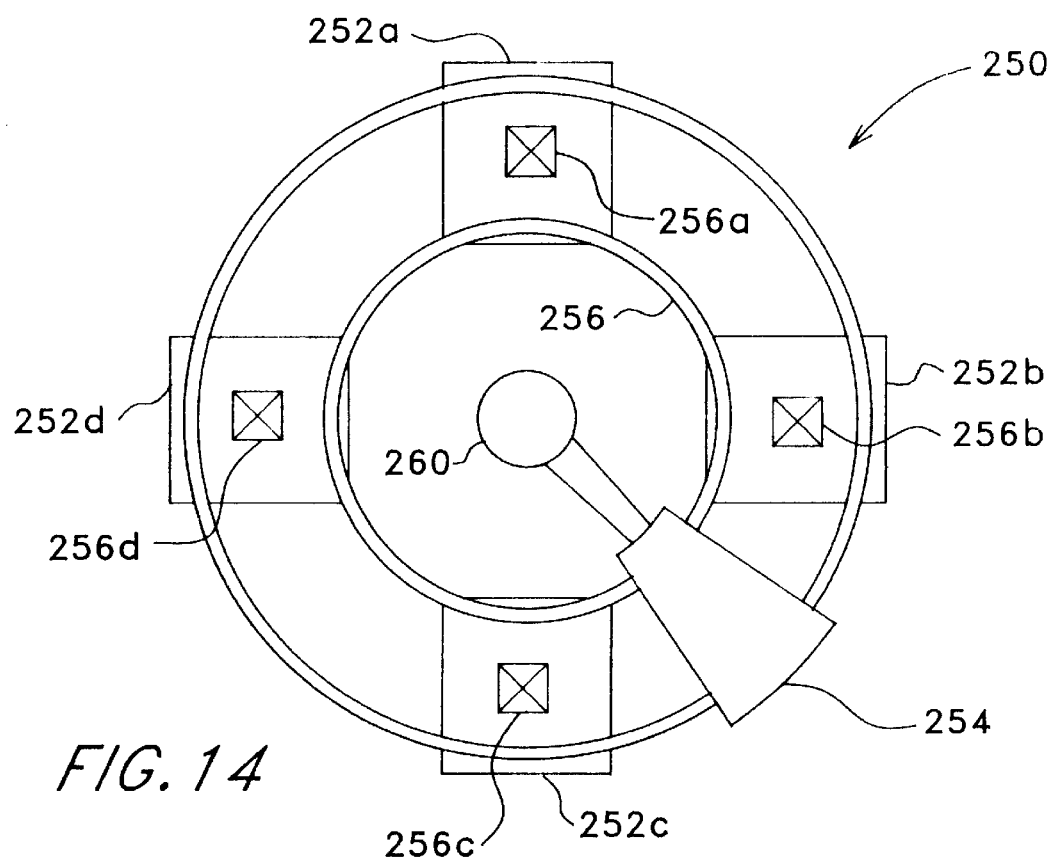
FIG. 14 is a diagrammatic plan view of an alternative multi-source treatment system illustrating an arrangement for moving a handling chamber using a circular track.

Turning now to FIG. 14, in still another embodiment a circular multi-source treatment system manufactured in accordance with the present invention is generally indicated by reference number 250. System 250 is diagrammatically shown in plan view to particularly illustrate an alternative configuration for the arrangement of four evacuable treatment source chambers 252a-d. A wedge-shaped handling chamber 254 is supported for movement on inner and outer rails 256 and 258, respectively. Although handling chamber 254 is illustrated as being wedged-shaped any other shape may be accommodated and, in fact, handling chamber 134 of FIG. 6 can be utilized with appropriate modifications. A movement mechanism 260 is positioned, for example, within inner track 256 for selectively placing wedge-shaped chamber 254 at each source chamber 252 in accordance with a particular treatment process. Each of source chambers 252a-d includes a respective gate valve 256a-d, like the source chambers in the previously described multi-source embodiments. System 250 otherwise includes all previously described components necessary for its proper operation such as, for example, evacuation pumps, handling chamber gate valve, etc. In the interest of brevity, these components are not shown and will not be further described, however, their presence is likewise understood to be essential to the operation of circular multi-source system 250.

Figure 15:
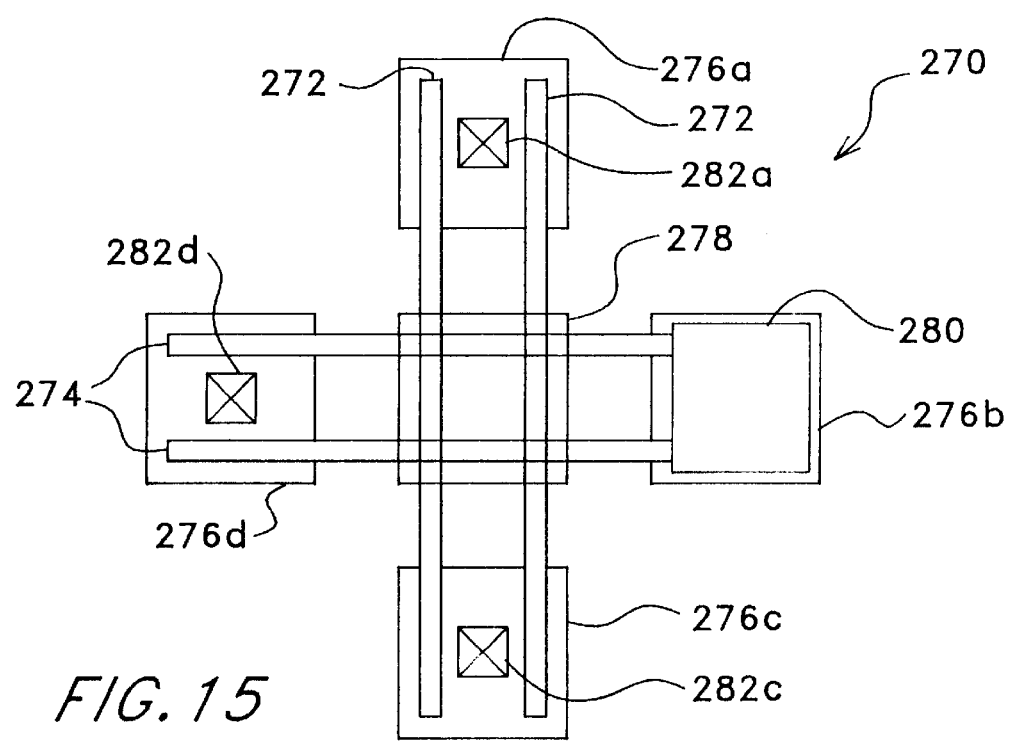
FIG. 15 is a diagrammatic plan view of still another alternative multi-source treatment system illustrating an arrangement for moving a handling chamber on orthogonal tracks.

In still another example, FIG. 15 illustrates an orthogonal track multi-source treatment system 270. Orthogonal system 270 includes first and second pairs of tracks 272 and 274, respectively, extending between four treatment source chambers 276a-d. A conventional track switching mechanism 278 cooperates with a handling chamber 280 to permit the selective movement of handling chamber 280 between treatment source chambers 276a-d. Each source chamber 276a-d includes a respective source chamber gate valve 282a-d, although gate valve 282b cannot be seen due to the positioning of handling chamber 280. System 270 otherwise includes all previously described components necessary for its proper operation such as, for example, evacuation pumps, handling chamber gate valve, etc. In the interest of brevity, these components are not shown and will not be further described, however, their presence is likewise understood to be essential to the operation of orthogonal multi-source system 270. It should also be understood that a multi-source treatment system can be arranged in an unlimited number of different ways as evidenced by the foregoing examples and that all of these arrangements are considered to be within the scope of the present invention.

Having described the systems and methods of the present invention, attention is now directed to FIGS. 16 and 17 which illustrate an actual working embodiment of a multi-source web treatment system manufactured in accordance with the present invention and generally illustrated by reference number 300. Inasmuch as several embodiments of multi-source systems of the present invention have been described above, a detailed description of the working embodiment of FIGS. 17 and 18 will not be provided herein. As seen in the figures, working embodiment 300 includes a movable web chamber 302 having a web transport mechanism 304 positioned therein. Web chamber 302 is selectively movable between four treatment stations 306a-d by a transport mechanism 308. Operation of the working embodiment likewise parallels the methods described above with regard to multi-source embodiments.

One skilled in the art may devise many alternative configurations for the systems and methods disclosed herein. For instance, any of the above-described multi-source systems can include more than one handling chamber, particularly in embodiments which are envisioned as including a large number of treatment stations. Therefore, it should be understood that the present invention may be embodied in many other specific forms without departing from the spirit or scope of the invention and that the present examples and methods are to be considered as illustrative and not restrictive, and the invention is not to be limited to the details given herein, but may be modified within the scope of the appended claims.

What is claimed is:

1. A system for treating a surface along a length of a flexible web in accordance with a treatment process that exposes said web surface to a series of treatment sources in an evacuated environment, said system comprising:

a) a handling chamber arrangement including an evacuable handling chamber having a handling chamber opening;

b) web transport means positioned within said handling chamber and designed to receive said web for progressively moving successive portions of the web surface through a treatment zone adjacent said handling chamber opening;

c) a treatment source chamber arrangement including a series of spaced apart evacuable source chambers, each source chamber having a source chamber opening;

d) treatment source means including one of said treatment sources located within each one of said source chambers;

e) control means for selectively opening and closing each of said handling and source chamber openings at predetermnined points during said process;

f) moving means for selectively moving said handling chamber between said source chambers such that the handling chamber can be temporarily positioned adjacent the source chambers so that said each source chamber opening can be temporarily aligned with the handling chamber opening to permit exposure of said web surface in said treatment zone to each of said sources through said temporarily aligned openings in cooperation with said web transport means; and g) evacuation means cooperating with the opening control means and the moving means for maintaining said source chambers and said handling chamber in an evacuated state during said exposure and said movement so that the treatment sources and the web can be maintained under vacuum throughout the exposure of the web surface to said series of said treatment sources.

2. A system according to claim 1 wherein said moving means includes a pair of rails defining detents configured for engagement by a plurality of rail wheels rotatably mounted on the handling chamber, said detents being located at predetermined positions corresponding to said each source chamber such that the handling chamber is located in a disengagable manner at a selected one of said source chambers.

3. A system for exposing one or more elongated webs to at least one treatment source in accordance with a treatment process that requires an evacuated environment, each web being provided from a roll and defining a web surface along a length, said system comprising:

a) a chamber arrangement including
   i) an evacuable web chamber for receiving at least a first one of said webs, said web chamber being positionable at a first chamber station;
   ii) an evacuable source chamber designed to contain said treatment source therein, and
   iii) an arrangement for defining a passage between said web chamber and said source chamber with said web chamber positioned at said first chamber station;

b) web transport means for progressively moving the length of said first web through a treatment zone in the web chamber and adjacent said passage such that a portion of said web surface is exposed to the treatment source in the treatment zone;

c) passage operating means for selectively closing said passage in a vacuum sealed manner, said passage operating means being movable between a first, open position such that said source and web chambers are in communication with one another through said passage and a second, closed position such that said source and web chambers are vacuum sealed from one another;

d) means for evacuating said source and web chambers; and e) treatment means including said treatment source located within said source chamber for treating said first web within said web chamber through said passage when the source and web chambers are both evacuated and when said passage operating means is in the passage open position, whereby substantially all the length of the web surface is exposed to the treatment source and, following treatment of said first web, the first web can be removed from the web chamber and replaced with a second web while maintaining the evacuation of said source chamber by moving said passage operating means to the closed position before removing said first web.

4. A system for treating at least one surface of at least one web in accordance with a treatment process, said web being provided from a roll having an elongated length and said process requiring exposure of at least one surface of said web along said length to a plurality of treatment sources in an evacuated environment, said system comprising:

a) a handling chamber arrangement including an evacuable handling chamber which is designed to receive said web, said handling chamber arrangement having a handling chamber opening into said handling chamber;

b) a source chamber arrangement including a plurality of evacuable source chambers such that one of said plurality of said treatment sources is positioned within an associated one of said evacuable source chambers, said source chamber arrangement including a source chamber opening into each of said evacuable source chambers;

c) control means for selectively opening and closing each of said handling and source chamber openings;

d) moving means for selectively providing movement of said handling chamber relative to said source chambers such that any said source chamber opening can be temporarily aligned with the handling chamber opening so as to expose said surface of the web to each of said sources through said temporarily aligned openings;

e) web transport means cooperating with said moving means for exposing a portion of said web surface to each of said treatment sources in a treatment zone in said handling chamber and adjacent said handling chamber opening by progressively transporting said web through said treatment zone during the temporary alignment between the handling chamber opening and any said source chamber opening; and f) evacuation means cooperating with the control means and the moving means for maintaining said source chambers and said handling chamber in an evacuated state during said exposure to said plurality of said treatment sources, and said movement such that substantially all the at least one surface is treated by the treatment sources and the web is maintained under vacuum throughout the exposure of all the at least one surface to all of the treatment sources.

5. A method of exposing one or more webs to a treatment source in accordance with a treatment process that requires an evacuated environment, each web having an elongated length along which a web surface is defined, said method comprising steps of:

a) providing a web chamber having a first one of said webs positioned therein;

b) providing a source chamber cooperating with said web chamber so as to define a passage therebetween, said source chamber having said treatment source positioned therein;

c) evacuating said web and source chambers to produce said evacuated environment;

d) progressively exposing portions of said web surface of said first web to said treatment source through said passage; and e) thereafter, closing said passage so that said source chamber remains evacuated to permit removal of said first web from said web chamber and replacement with a second one of said webs while said treatment source remains in said evacuated environment in the source chamber.

6. A method according to claim 5 wherein said web is provided from a roll and said step of progressively exposing the web surface includes steps of unrolling said portions from the rolled web prior to exposure and re-rolling said portions following said exposure.

7. A method of treating one or more elongated webs in accordance with a treatment process that requires sequential exposure of a surface which extends along a length of each web to a plurality of treatment sources in an evacuated environment, said method comprising steps of:

a) providing a handling chamber having a handling chamber opening and having a first one of said webs positioned in the handling chamber;

b) providing a plurality of source chambers such that each of said plurality of said treatment sources is positioned within a different one of said source chambers, each source chamber having a source chamber opening;

c) selectively providing movement of the handling chamber so as to temporarily align each of the source chamber openings with the handling chamber opening;

d) sequentially exposing said surface of said first web to all of said sources by progressively exposing successive portions of said web surface to each one of said sources through said temporarily aligned openings in cooperation with selectively opening and closing said chamber openings until substantially all of said surface has been exposed to each source; and e) maintaining said handling chamber and said source chambers under vacuum during said exposure and said movement such that each of the treatment sources and the web are maintained under vacuum during said sequential exposure of said surface to said plurality of said treatment sources and the surface is exposed to each said treatment source.

8. A method according to claim 7 wherein said web is provided from a roll and each said step for progressively exposing the web surface to each said source includes steps of unrolling said successive portions from the rolled web prior to said exposure and re-rolling said portions following said exposure.

* * * * *